United States Patent
Bores et al.

(10) Patent No.: US 6,267,245 B1
(45) Date of Patent: Jul. 31, 2001

(54) CUSHIONED WAFER CONTAINER

(75) Inventors: Gregory W. Bores, Prior Lake, MN (US); Michael C. Zabka, Barron, WI (US)

(73) Assignee: Fluoroware, Inc., Chaska, MN (US)

( * ) Notice: Subject to any disclaimer, the term of this patent is extended or adjusted under 35 U.S.C. 154(b) by 0 days.

(21) Appl. No.: 09/349,314

(22) Filed: Jul. 8, 1999

Related U.S. Application Data

(60) Provisional application No. 60/092,247, filed on Jul. 10, 1998.

(51) Int. Cl.[7] ................................................ B65D 85/90
(52) U.S. Cl. ............................ 206/711; 29/428; 206/454
(58) Field of Search ..................... 81/485, 486; 206/454, 206/591, 711, 832, 833; 211/41.18; 414/935–937, 939, 941; 29/428

(56) References Cited

U.S. PATENT DOCUMENTS

| | | |
|---|---|---|
| 4,043,451 | 8/1977 | Johnson . |
| 4,248,346 | 2/1981 | Johnson . |
| 4,555,024 | 11/1985 | Voss et al. . |
| 5,024,329 | 6/1991 | Grohrock . |
| 5,207,324 | 5/1993 | Kos . |
| 5,253,755 * | 10/1993 | Maenke ................... 206/454 |
| 5,273,159 * | 12/1993 | Gregerson ................ 206/454 |
| 5,472,086 | 12/1995 | Holliday et al. . |
| 5,482,161 | 1/1996 | Williams et al. . |
| 5,555,981 * | 9/1996 | Gregerson ................ 206/711 |
| 5,586,658 | 12/1996 | Nyseth . |
| 5,785,186 * | 7/1998 | Babbs et al. ............. 206/454 |
| 5,788,082 * | 8/1998 | Nyseth ..................... 206/711 |
| 5,816,410 | 10/1998 | Nyseth . |
| 5,915,562 | 6/1999 | Nyseth et al. . |

FOREIGN PATENT DOCUMENTS 0744765    11/1996   (EP) .

* cited by examiner

*Primary Examiner*—Jim Foster
(74) *Attorney, Agent, or Firm*—Patterson, Thuente, Skaar, & Christensen, P.A.

(57) ABSTRACT

A wafer container comprising a receptacle and door provides for horizontal minimal contact support of wafers and provides for vertical support without one surface support intermediate the front edge support and rear edge support. The wafer carrier has for each wafer two distinct levels of support axially offset from one another. The first level of support is by wafer shelves contacting the bottom surface at the left side and right side of each wafer. The second level of support is provided by cushions securing the wafer at the front edge and back edge without one surface support at the left and right edges. The cushions on the door and at the rear of the receptacle are preferably removable such as by folding or compressing the cushion unit. The cushions preferably have V-shaped wafer engaging elements to constrain the wafer edge and to provide a lower ramp surface to guide and lift the front and rear edges of the wafer upwardly from the first level to the second level of support when the door is placed in position in the open front of the container portion.

21 Claims, 7 Drawing Sheets

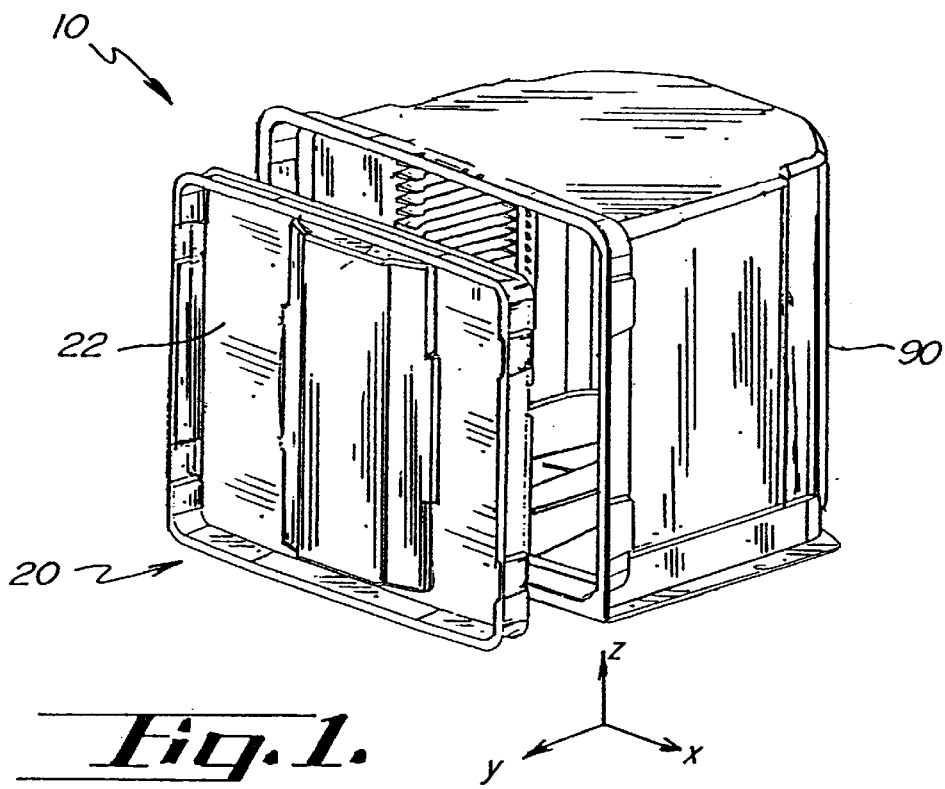
_Fig. 1._
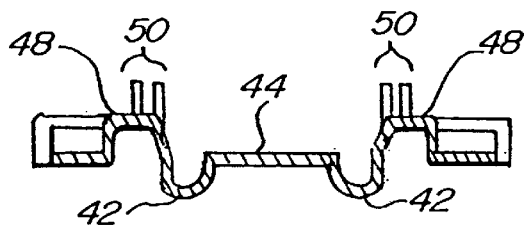
_Fig. 3B._
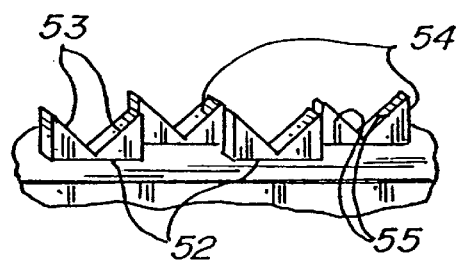
_Fig. 3C._
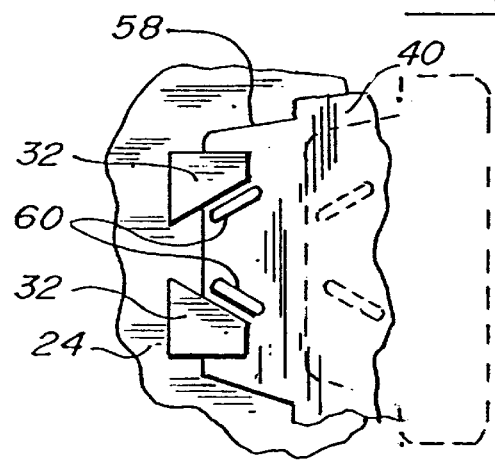
_Fig. 4B._

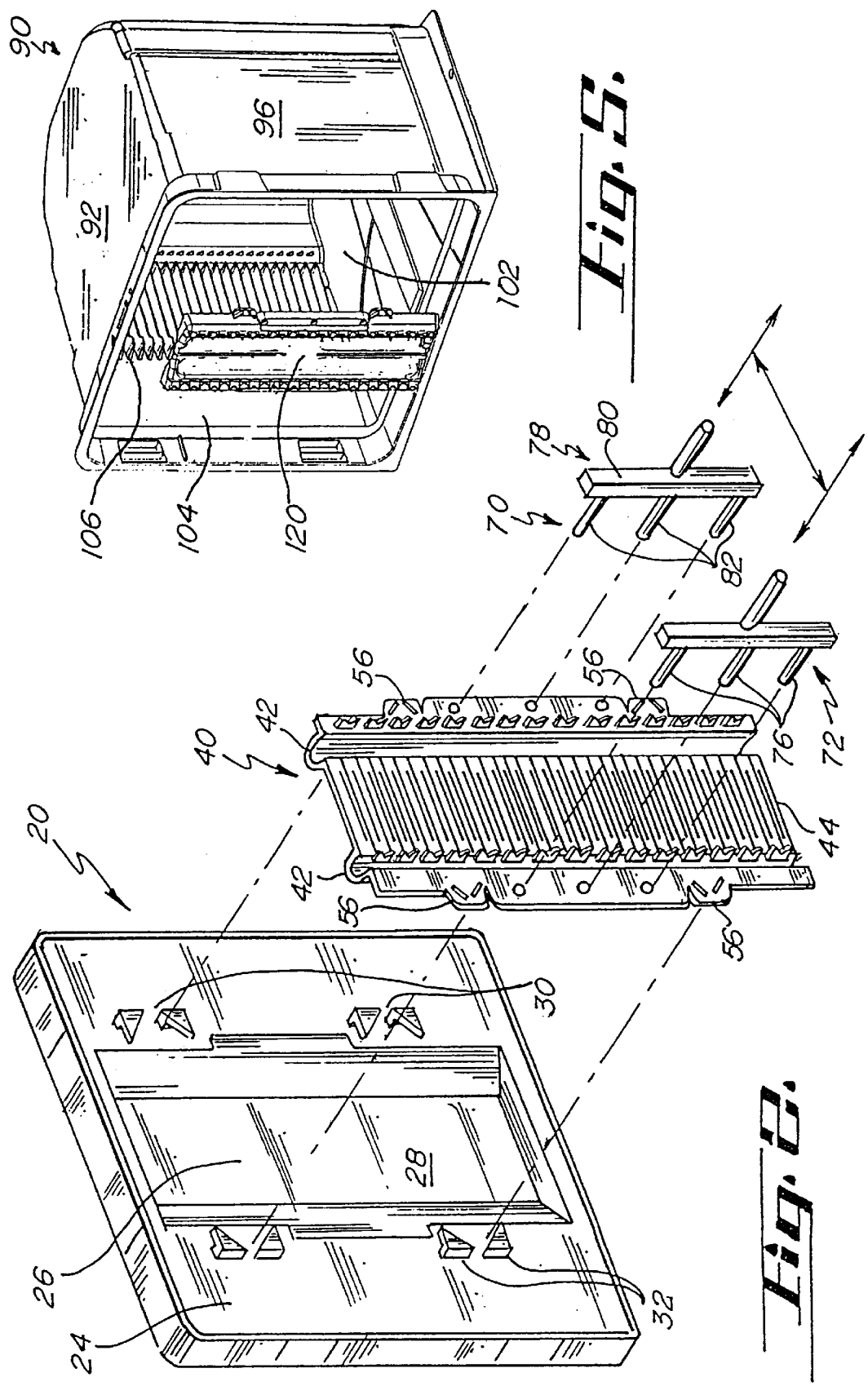

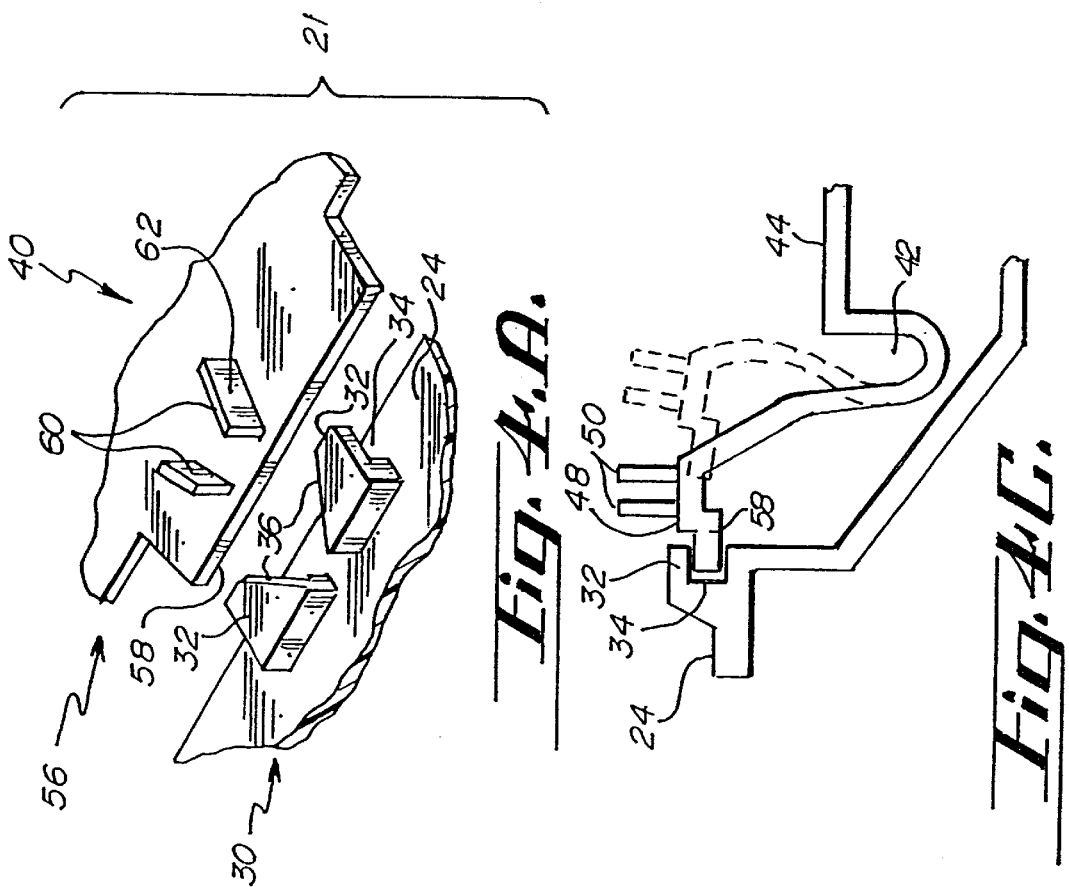
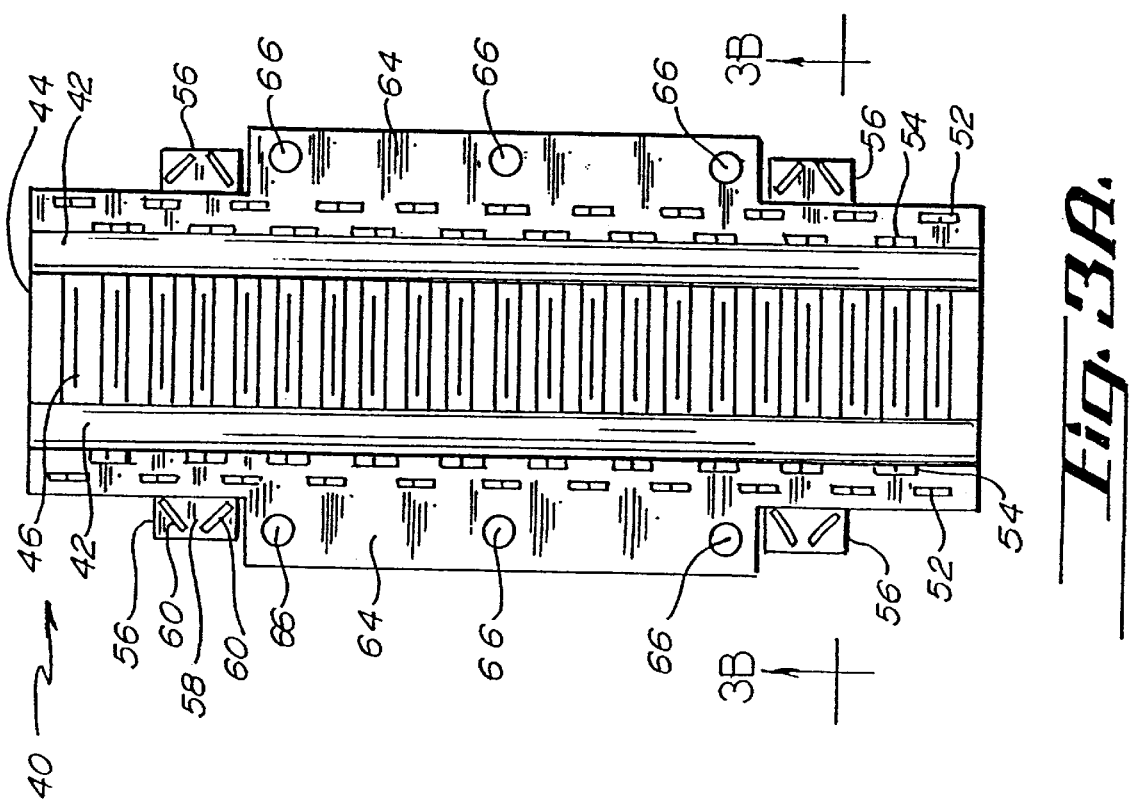

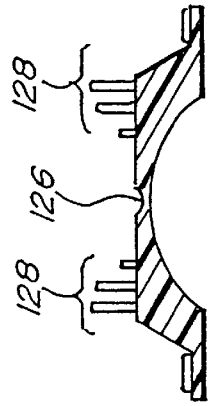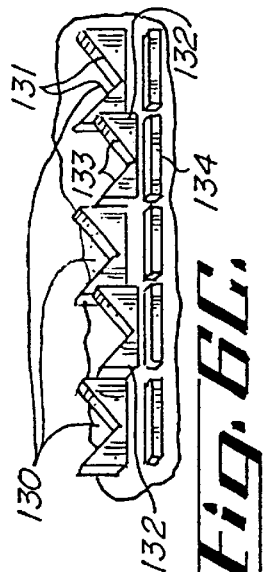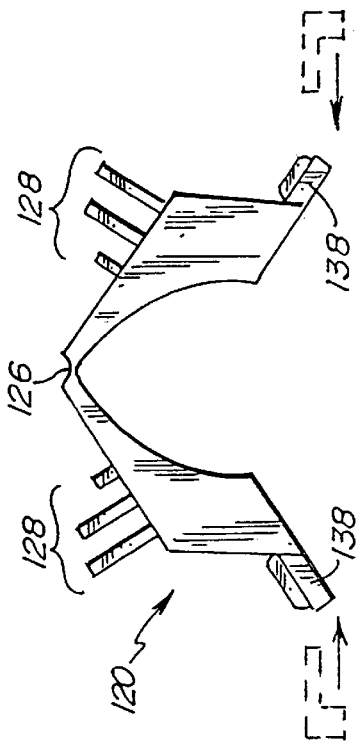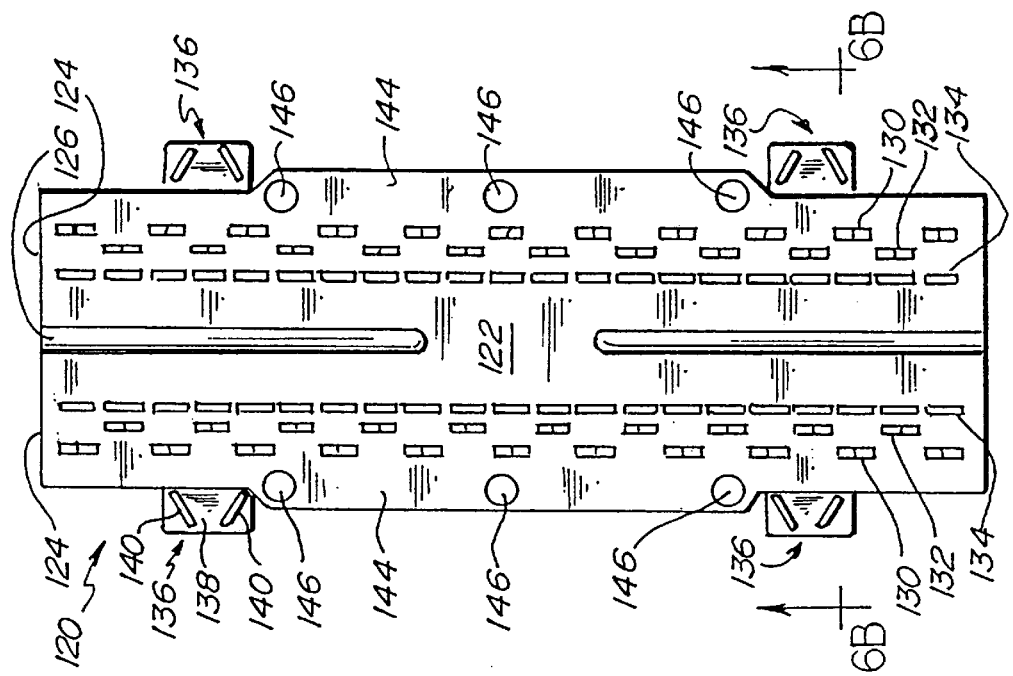

CUSHIONED WAFER CONTAINER

This application claims the benefit under 35 U.S.C 119(e) of U.S. Provisional Application No. 60/092,247 filed on Jul. 10, 1998.

This invention relates to wafer containers with cushions to secure the wafers during the transport, shipping, and storage of wafers.

BACKGROUND OF THE INVENTION

During processing, semiconductor wafers are subjected to numerous process steps in various machines and at various locations. The wafers must be transported from workstation to workstation and from facility to facility. Numerous types of shipping devices have been previously known for handling, storing, and shipping wafers. Such devices hold the wafers in axially aligned arrays with, for example, twenty-five wafer arrays. Where the wafers are shipped from facility to facility and where the containers containing the wafers may be subjected to significant shock, the containers are configured to hold the wafers vertically. A vertical wafer is less prone to damage from shock or vibration than a wafer horizontally suspended by its edges.

A principal component of the shipping containers is a means for cushioning the wafer during transport to protect against physical damage from shock and vibration. Such shipping containers and cushioning means have been previously known as disclosed, for example, in U.S. Pat. Nos. 4,043,451; 4,248,346; 4,555,024; 5,253,755; 5,273,159 and 5,586,658. These types of containers typically included vertical wafer-receiving channels which have been provided with cushions at the upper and lower ends. These shipping devices are designed to transport wafers or disks in a vertical orientation from place to place, whereas conventional processing workstations require removing horizontally the wafers for processing.

With the vertically-oriented carrier, wafer-receiving channels are generally designed to hold wafers firmly with a minimum of horizontal movement. Also such carriers generally allow the wafers to bear against the vertical surfaces of the wafer channels. The vertical slots of such carriers are typically smooth, that is featureless to allow the wafers to be slid in and out of the slots with minimal abrading and scraping. Whereas with the horizontally-oriented process carrier, wafer-receiving channels are relatively larger to enable wafers to be lifted off of seating positions on horizontal wafer shelves and robotically removed from the slot without contact of the carrier by the wafer. Moreover, horizontal carriers now in use for transporting wafers within fabrication facilities, particularly for larger wafers, i.e. 300 mm, are now being designed for minimal contact with wafers. See U.S. Pat. No. 5,788,082 to Nyseth and assigned to the owner of the invention of the instant application. A pair of shelves will contact the bottom side of the wafer at four regions of contact. Each region will be by a protrusion extending from the shelf and will create a point or an abbreviated line contact with the shelf. Such protrusions are not seen in the conventional vertical wafer shippers and such conventional vertical shippers do not provide for this minimal contact. Thus, conventional vertically-oriented carriers are not ideally suited for use as horizontally-oriented carriers, for use as transport modules in fabrication facilities intermediate process steps.

The evolution of wafer processing to larger wafers has exacerbated a phenomena known as "flutter." Flutter is the vibration or bouncing of the wafer on the one restrained side of the wafer, that is, the wafer shelves; or in conventional vertical carriers along the one side of the channel that the wafer is resting against. Such vibration or bouncing is highly undesirable in that it can generate or launch particles in the carrier and damage the wafer. Flutter occurs when the wafer container is subjected to shock. Flutter can occur even where the two opposite ends (front edge and back edge) of the wafer are restrained and the intermediate portion (left edge and right edge) is restrained on only one of the top and bottom surface of the wafer. The flutter phenomena is particularly pronounced in 300 mm wafers now being used in fabrication facilities.

Horizontally-oriented wafer carriers with cushions are known. See U.S. Pat. No. 5,915,562 to Nyseth and Krampotich and assigned to the owner of the instant invention. This patent discloses an active cushion that moves inward and engages the front edges of the wafer after the door is secured in place. Passive cushions mounted to the door on front opening carriers are also known. Such cushioned (passive and active) horizontal carriers still have the wafers restrained intermediate the front and back end on only one surface. Thus, the wafer are subject to flutter. Where such an arrangement is rotated 90 degrees to provide a vertically oriented shipper, the flutter problem can be significant.

A carrier is needed that can function effectively as a vertical shipper that still has the advantages of minimal contact when the wafers are oriented horizontally.

SUMMARY OF THE INVENTION

Attachment of the first and second cushions to the wafer carrier may be accomplished in essentially the same way. Initially the wafer carrier is provided with a first fastening feature for each cushion. One first fastening portion is located on the interior surface of a door of a wafer carrier, while another first fastening portion is located at the rear interior wall of a wafer carrier receptacle. Each cushion is provided with a complementary second fastening portion. Preferably, the first and second fastening portions comprise a plurality of fingers which cooperatively engage tabs such as by underlying. More specifically, the fingers may be parallel to, and spaced from the interior surfaces of the carrier such that they present a series of slots. The tabs, which extend from the cushions, are sized to slidingly engage the slots defined by the fingers and the interior walls as the cushions are attached and removed from the wafer carrier. Lands extend between the tabs on each side of each cushion, with the lands including a plurality of apertures sized to accept pins of an attachment tool. The first and second cushions may be manually, temporarily deformed for attachment and removal, such temporary deformation may preferably be accomplished by an attachment tool to reduce the contamination of wafers by particle or other contaminants associated with manual handling.

A further feature and advantage of preferred embodiments of the invention is that the wafers are effectively and gently constrained from movement by the shape of the wafer-receiving elements of the cushions and the cushion material itself. In a preferred embodiment each cushion is provided with a plurality of wafer-receiving elements which extend along the length thereof in two sets of parallel rows. The wafer-receiving elements of each such parallel row are staggered with respect to each other to maximize the guiding function of each element. To that end, each wafer receiving element is provided with converging surfaces which serve to guide and retain wafers prior to and while they engage the cushions.

It is an object of preferred embodiments of the present invention to provide a wafer carrier which has a conventional wafer support, or seating level on shelves with a removable second wafer supports or cushions which provide a axially offset transport level.

It is an object of the present invention to provide a wafer carrier with cushions which securely retain wafers within the carrier.

Another object of the invention is to reduce contamination of wafers during transport and storage.

Still another object of preferred embodiments of the invention is to support wafers in a wafer carrier at one level when a door is attached and at a different level when the door is removed.

In a preferred embodiment a further feature of the invention is that the cushions function to lift the wafers from the first operational level to the second transport level.

The first cushion may be provided with a pair of longitudinal channels which interposed between the parallel rows of wafer-receiving elements and the v-shaped trough cushion elements. When the side of the first cushion are pressed together, the channels are temporarily deformed which facilitates attachment and removal. The second cushion may be provided with preferential fold lines or living hinges along the longitudinal axis of the body of the cushion. These fold lines or living hinges allow the second to essentially fold upon itself when the sides of the cushion are pressed together. In order to ensure that the second cushion returns to a normal planar state, the preferential fold lines or living hinges may extend less than the full length of the cushion. The portion of the cushion body which does not have a preferential fold line serves to restore the cushion to a normal planar state.

It should be noted that while the first and second cushions may be temporarily deformed by the various means described above, it is clear that other means may be utilized, for example, longitudinal kerfs.

In preferred embodiments, the cushions function to cushion wafers so that they are effectively and gently constrained from movement by the cushion material itself. In this regard, a preferred cushion material is polybutylene terephthalate known in the industry as HYTREL® manufactured by E. I. DuPont De Nemours & Co., Wilmington, Del. However, other similar material which exhibits the desired resiliency and toughness may be used.

In use, a wafer carrier incorporating the invention herein operates as follows. With the door removed, wafers are inserted into the carrier in the normal fashion wherein the wafers are horizontally inserted without contact between the wafer and the carrier. Each wafer is then lowered to seat upon the wafer shelves located at the right and left edges and bottom surface of the wafer. At this point, the rearmost edge of the wafers is not in contact with the longitudinal cushion of the second cushion. The door is then attached to the receptacle. As the door is seated within the insertion and removal opening of the receptacle, the wafer-receiving elements of the first and second cushions come into contact with the edges of the wafers. As the door continues to be seated, the converging surfaces of the wafer-receiving elements guide, support, and lift the wafers out of contact with the internal wafer support channels levels to the second support levels defined by the first and second cushions. As the door is finally seated and locked into place, the edges of the wafers, guided, supported, and lifted by the converging surfaces of the wafer-receiving elements are seated within the respective cushion elements and are no longer in contact with the wafer side supports. In this state, the carrier can be rotated 90 degrees to orient the wafer vertically. The wafers are effectively and gently constrained from movement and shock and are not subject to flutter during shipment.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 1 shows a perspective view of a wafer carrier of the present invention.

FIG. 2 shows a partial, exploded, perspective view of the interior surface of the door of FIG. 1, a first longitudinal cushion which attaches to the door, and an attachment tool.

FIG. 3A shows a plan view of the interior facing surface of the first longitudinal cushion of FIG. 2.

FIG. 3B is a cross-sectional view of the first longitudinal cushion of FIG. 3A taken along line A—A.

FIG. 3C is partial perspective view showing the arrangement of the wafer guide/supports of the first longitudinal cushion of FIGS. 3A and 3B.

FIG. 4A is a partially exploded perspective view of the fastening device of the present invention.

FIG. 4B is a partial top view of the fastening device of the present invention depicting engagement in solid lines and disengagement in dashed lines.

FIG. 4C is a partial cross-sectional view of one of the fastening portions of the first longitudinal cushion as it engages (solid lines) and disengages (dashed lines) from a corresponding fastening portion of the door.

FIG. 5 is a perspective view of a wafer carrier receptacle and a second longitudinal cushion prior to installation against the rear interior wall of the wafer carrier.

FIG. 6A shows a plan view of the interior facing surface of the second longitudinal cushion of FIG. 5.

FIG. 6B is a cross-sectional view of the second longitudinal cushion of FIG. 6A taken along line B—B.

FIG. 6C is partial perspective view showing the arrangement of the wafer guide/supports and cushion elements of the second longitudinal cushion of FIGS. 6A and 6B.

FIG. 8B is an end view of the second longitudinal cushion of FIG. 8A showing the cushion in the flexed state for insertion and removal from a wafer carrier receptacle.

Figure 9:
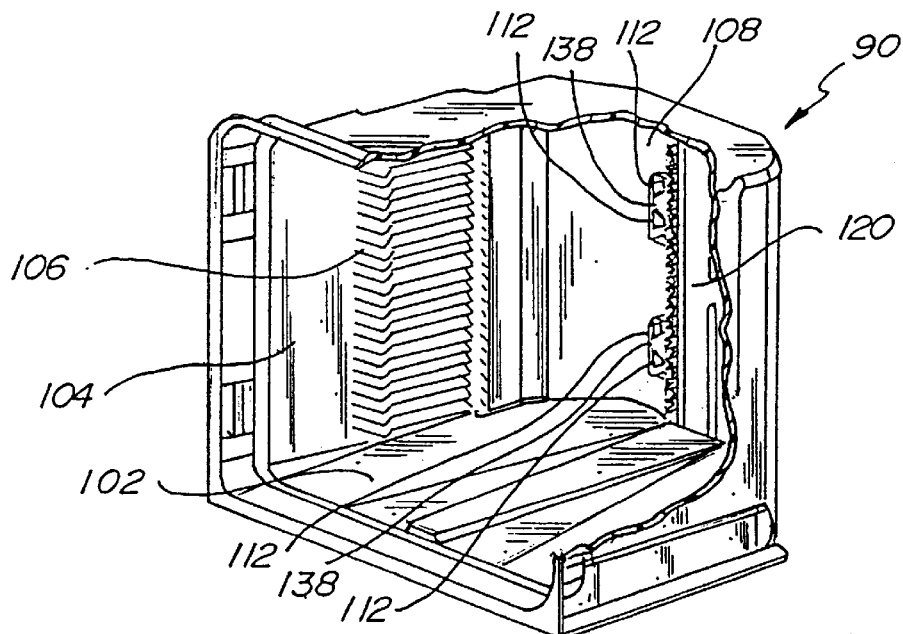
FIG. 9 is a partial, sectional view of the second longitudinal cushion attached to the rear wall of a wafer carrier receptacle.

It is understood that the above figures are for illustrative purposes only and are not meant to limit the scope of the claimed invention.

DETAILED SPECIFICATION

As depicted in FIG. 1, a removable cushion system is provided for a wafer carrier 10 comprising a removable door 20 and a receptacle 90.

As depicted in FIGS. 1 and 2, door 20 has an exterior surface 22 and an interior surface 24. Interior surface 24 includes a cushion-receiving portion 26 which includes a recess or bay 28 and a first portion 30 of a fastening device (shown in greater detail in FIGS. 4A and 4B). The first portion 30 of the fastening device is located on interior surface 24, about the perimeter of recess or bay 28, and comprises a plurality of fingers 32 which are spaced from the interior surface 24 and which project toward recess 28. Together, fingers 32 and interior surface 24 form a plurality of slots (shown in greater detail in FIG. 4A) which are sized to receive a second portion of the fastening device.

Returning to FIG. 2, first cushion 40 includes the second portion 56 of the fastening device (shown in greater detail in FIGS. 4A and 4B). The second portion 56 comprises a plurality of tabs 58 located at opposite sides of cushion 40 and which extend outwardly therefrom in the plane of the cushion so that they may engage fingers 32 of the first fastening device. Cushion 40 also includes a plurality of apertures (shown in greater detail in FIG. 3A) which are sized to accommodate an attachment tool 70.

Attachment tool 70 comprises a first segment 72 and a second segment 78. The first and second segments 72, 78 include arms 74, 80 onto which a plurality of parallel pins 76, 82 are attached. Parallel pins 76, 82 extend away from arms 74, 80 so that they may come into engagement with apertures of first cushion 40. First and second segments 72, 78 of attachment tool 70 are moveable with respect to each other and with respect to door 20, to enable cushion 40 to be attached and removed from door 20.

As depicted in greater detail in FIGS. 3A, 3B, and 3C first cushion 40 comprises a pair of channels 42 whose interior facing sides are connected to each other by a web 44 which comprises a plurality of v-shaped cushion segments 46. The other, exterior facing sides of channels 42 are provided with wings 48 which extend upwardly and outwardly, relative to web 44. Wings 48 support a wafer guide/support 50 and terminate at an outer edge from which the second portion 56 of the fastening device, and a land 64 extend.

Wafer guide/support 50 comprises an outer row of wafer-receiving elements 52 and an inner row of wafer-receiving elements 54. As shown in FIG. 3C, rows 52 and 54 are parallel and staggered relative to each other. Rows 52, 54 include converging surfaces 53, 55 which serve to guide and support wafers as door 20 with first cushion 40 attached thereto are brought into sealing relation with receptacle 90.

Returning to FIG. 3A, second portion 56 of the fastening device comprises a plurality of tabs 58 which extend outwardly from wing 48. Each tab 58 includes ribs or fins 60 which cooperate with fingers 32 of first portion 30 of the fastening device. Land 64, also located on the edge of wing 48 is positioned between tabs 58 and includes a plurality of apertures 66 extending therethrough which are sized to receive pins of attachment tool 70.

As depicted in FIGS. 4A and 4B, fastening device 21 comprises first portion 30 and second portion 56, with fist and second portions operatively connectable to each other to permit attachment of cushion 40 to wafer carrier door 20. Although first portion 30 comprises a plurality of fingers 32 and second portion 56 comprises a plurality of tabs 58, only the interaction with one tab and its corresponding fingers will be shown. As can be seen, tab 58 is sized to be slidingly received by slots 45 formed between fingers 32 and surface 24. As tab 58 moves into operative engagement with fingers 32, tab 58 is aligned and positioned by walls 62 of ribs 60 which engage guide walls 36 of fingers 32. Tab 58 is moved out of operative engagement with fingers 32 when tab 58 clears the inner edge of fingers 32 (shown in dashed lines in FIG. 4B). Although first portion 30 comprises a plurality of tabs 58, it is understood that other types of fastening devices may be used.

Referring to FIG. 4C, first cushion 40 is shown as being attached to interior surface 24 of door 20. Here, as in FIGS. 4A and 4B, only one tab and associated finger are depicted. It may be seen, however, that tab 58 is slidingly received in slot 34 formed by finger 32 and interior surface 24. Disengagement of tab 58 from finger 32 may be seen in dashed lines. Cushion material is relatively pliable, which permits flexation of channel 42 sides toward each other. Thus, pressure exerted against wings 48 will cause them to move relative to web 44 and disengage tabs 58 from fingers 32. Note that pressure may be exerted by hand or by attachment tool 70 (not shown).

As depicted in FIG. 5, removable cushion system includes a receptacle 90 and second cushion 120. Receptacle 90 includes a top 92, a bottom, sides 96, front, and rear, which together define an interior 102 with interior sides 104 and a cushion-receiving portion 108. Interior sides 104 include conventional wafer supports 106 which form a first support level which supports a plurality of wafers in horizontal orientation. Second cushion 120 is depicted in unattached orientation relative to conventional wafer supports 106.

As depicted in greater detail in FIGS. 6A, 6B, and 6C, second cushion 120 comprises a body portion 122 having a pair of linear sections 124 which are movingly connected to each other by living hinges 126 which extend partially along a longitudinal axis of body portion 122 from opposite ends. Linear sections 124 support a wafer guide/support 128 and terminate at an outer edge from which the second portion 136 of the fastening device, and a land 144 extend.

Wafer guide/support 128 comprises an outer row of wafer-receiving elements 130, an inner row of wafer receiving elements 132, and a row of cushion elements 134. As shown in FIG. 6C, rows 130 and 132 are parallel and staggered relative to each other, while row 134 elements correspond to the both of the rows of wafer-receiving elements. Rows 130, 132 include converging surfaces 131, 133 which serve to guide and support wafers as they are brought into contact with cushion 120 by bringing door 20 with first cushion 40 attached thereto into sealing relation with receptacle 90.

Returning to FIG. 6A, second portion 136 of the fastening device comprises a plurality of tabs 138 which extend outwardly from linear section 124. Each tab 138 includes ribs or fins 140 which cooperate with fingers 112 of first portion 110 of the fastening device. Land 144, also located on the edge of linear section 124 is positioned between tabs 138 and includes a plurality of apertures 146 extending therethrough which are sized to receive pins of attachment tool 70.

Figure 7:
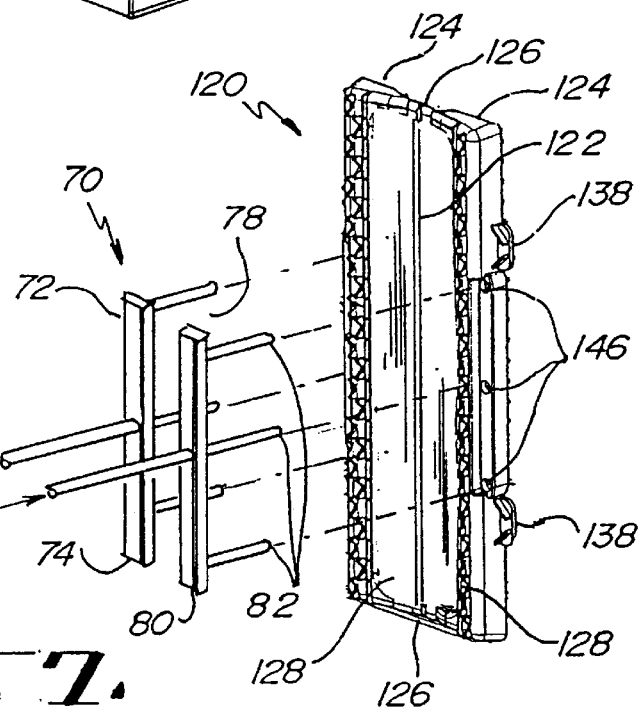
FIG. 7 is a partial, exploded perspective view of the attachment tool and the second longitudinal cushion.

As depicted in FIG. 7, second cushion 120 includes the second portion 136 of the fastening device (shown in greater detail in FIGS. 4A and 4B). The second portion 136 comprises a plurality of tabs 138 located at opposite sides of cushion 120 and which extend outwardly therefrom in the plane of the cushion so that they may engage fingers 112 of first fastening device. Cushion 120 also includes a plurality of apertures (shown in greater detail in FIG. 6A) which are sized to accommodate an attachment tool 70.

Attachment tool 70 comprises a first segment 72 and a second segment 78. The first and second segments 72, 78 include arms 74, 80 onto which a plurality of parallel pins 76, 82 are attached. Parallel pins 76, 82 which extend away from arms 74, 80 so that they may come into engagement with apertures of first cushion 40. First and second segments 72, 78 of attachment tool 70 are moveable with respect to each other and with respect to door 20, to enable cushion 40 to be attached and removed from door 20.

Figure 8A:
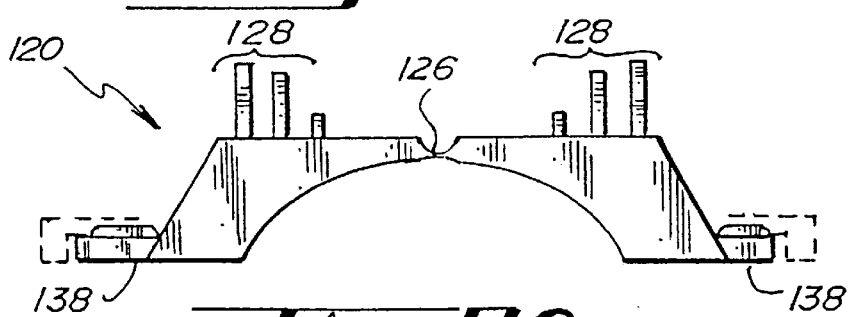
FIG. 8A is an end view of the second longitudinal cushion showing the cushion in a normal state.

FIGS. 8A and 8B depict second cushion in a normal planar state, a flexed or buckled state to enable engagement or disengagement of first 110 and second portions 136 of fastening device. In FIG. 8A, the juxtaposition between tabs 138 of second cushion 120 and fingers of cushion receiving surface 108 (shown in dashed lines) can be seen. In this figure, second cushion 120 is in a normal planar state. In FIG. 8B, the juxtaposition between tabs 138 and fingers of cushion-receiving surface 109 (also shown in dashed lines) can be seen. Here, tabs 138 are sufficiently disengaged from slots formed by fingers and cushion-receiving surface to enable cushion 120 to be withdrawn from receptacle (not shown). Cushion material is relatively pliable, which permits flexation of living hinge 126, and liner sections toward each other. Thus, pressure exerted against linear sections 124 will cause them to move relative to each other and disengage tabs 138 from fingers 112. Note that pressure may be exerted by hand or by attachment tool 70 (not shown).

As depicted in FIG. 9, second cushion 120 is attached to the rear cushion receiving surface 108 of receptacle 90, and tabs 138 are engagingly connected with fingers 112.

Figure 10A:
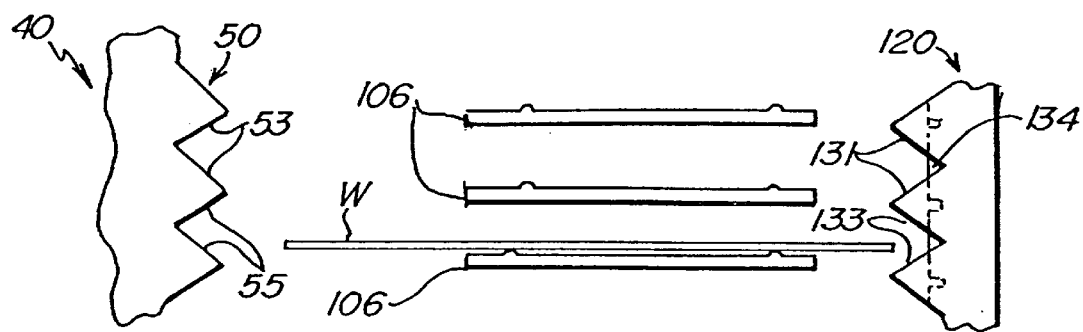
FIG. 10A is a partial, side view of a wafer in a receptacle prior to attachment of a wafer carrier door.

As depicted in FIG. 10A, wafer "W" is shown supported by wafer support 106 at the first level of the wafer carrier, with first cushion 40 second cushion 120 positioned at the front (door) and rear interior surfaces of the wafer carrier, respectively. Note that wafer guide/supports 50, 128 are offset from the internal receptacle wafer supports 106. Further note the converging surfaces 53, 55, 131, and 133 which form part of the wafer guide/supports.

Figure 10B:
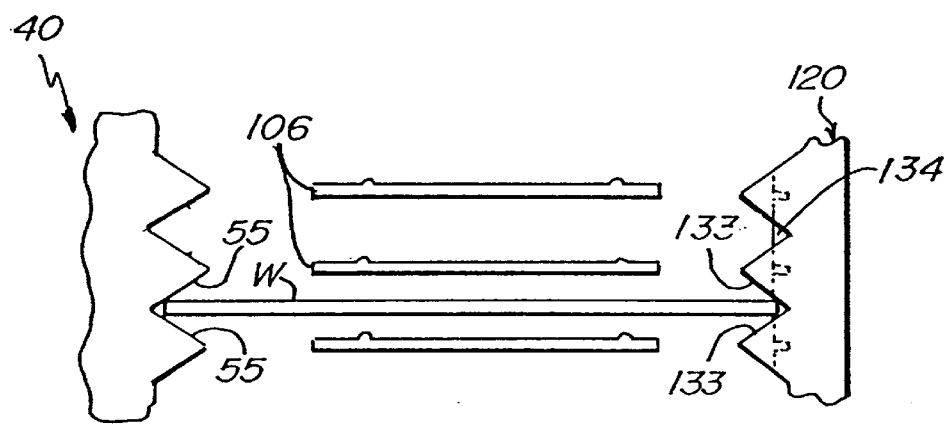
FIG. 10B is a partial, side view of the wafer of FIG. 10A after a wafer carrier door has been attached to a wafer carrier.

Referring to FIG. 10B, cushion 40 has been brought into contact with wafer W by attaching door 20 to receptacle 90 (not shown). When door is attached and seated to the receptacle converging surfaces 55, 133 of fist and second cushions 40, 120 cooperatively guide, lift, and support wafer W at a second support level. Note that due to the relatively softer, resilient nature of the first and second cushions, deformation will occur, at the converging surfaces and at the cushion elements. For example, see cushion element 134 (shown in solid and dashed lines) of second cushion 120. These deformations allow wafers to be more securely held when wafers are at the transport level defined by the first and second cushions.

Figure 11A:
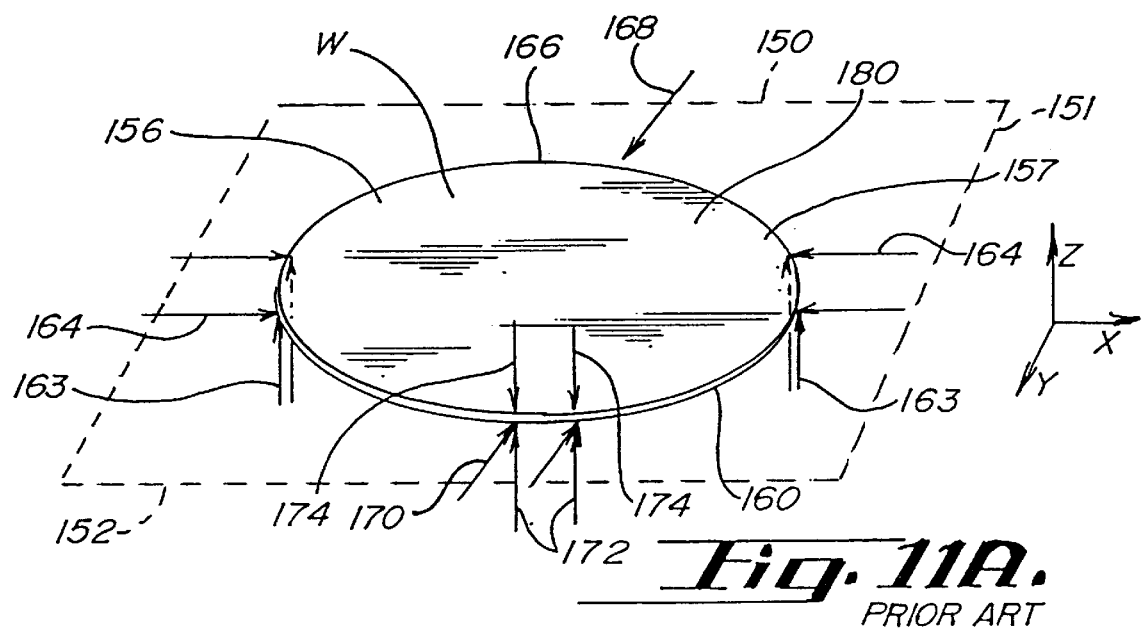
FIG. 11A is a schematic representation of the support in a prior art wafer carrier.
Figure 11B:
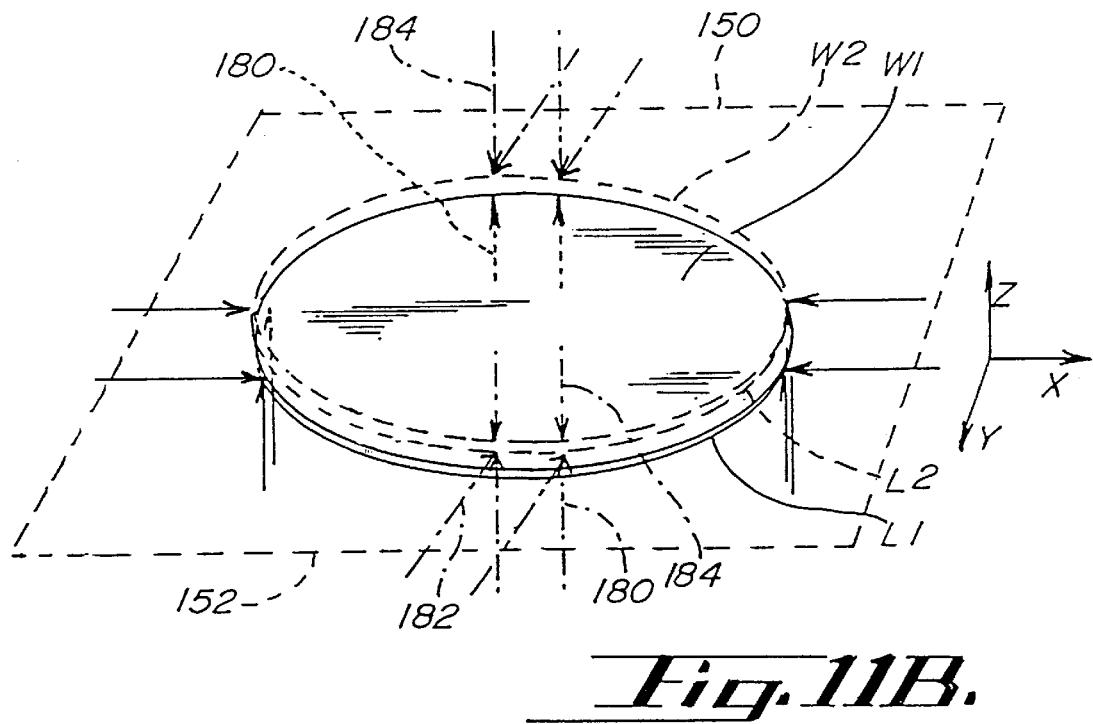
FIG 11B is a schematic representation of the two levels of support in a wafer carrier according to the instant invention.

Referring to FIGS. 11A and 11B, schematic representation of the invention compared to the prior art is illustrated. One wafer is shown and the carrier is represented by the dashed line with the numeral 150. The carrier comprises a receptacle portion 151 and a door 152 to close the front opening of the carrier. In the prior art carrier of FIG. 11A the wafers are inserted in the y axis direction and rest upon shelves at the left edge 156 and right edge 157 of the wafer which correspond to the left side 158 and right side 159 of the carrier. The shelves providing upward constraint (y direction) on the bottom surface 160 of the wafer at the left and right sides of the wafer as indicated by the arrows labeled 163 as well as providing lateral constraint as indicated with the arrows labeled 164. Typically there will also be rear lateral support at the back edge 166 of the wafer as indicated by the arrow labeled 169. Typically the upward this constraint will be by rigid nonflexible plastic members such as shelves made of polyetheretherketone or polycarbonate for example. When the door 152 is placed on the receptacle portion 151 additional wafer supports configured as cushions may provide rearward lateral restraint 170 on the y axis, upward restraint 172 on the z axis, and downward restraint 174 on the z axis. Thus there is constraint on the bottom surface of the wafer W at the sides of the wafer but not constraint on the upper surface 180. This condition will contribute to flutter when the wafer is in both the horizontal orientation as shown in the vertical orientation. Note that in the vertical orientation there would also typically be restraint against the top surface and bottom surface of the wafer at the rear edge of the wafer. Flutter would still be an issue in such orientation.

FIG. 11B illustrates a wafer W1 in a first support level L1 and the wafer moved to a second support level L2 indicated by the dashed lines labeled W2. At level one the wafer has the same support as discussed above with reference to FIG. 11A when the door is not attached. When the door is attached, the wafer is axially displaced to the second support level and the support at the sides of the wafer is eliminated. Support is provided by wafer supports, preferably configured as resilient cushions, at the front edge and rear edge of the wafer as indicated with the force arrows drawn with dots and dashes (for the hidden force arrows). Such support provides upper restraint 180, inward restraint 182, downward restraint 194 both at the front edge and the rear edge. This isolation of support by restraining the front edge and rear edge eliminates the flutter phenomena.

Figure 12:
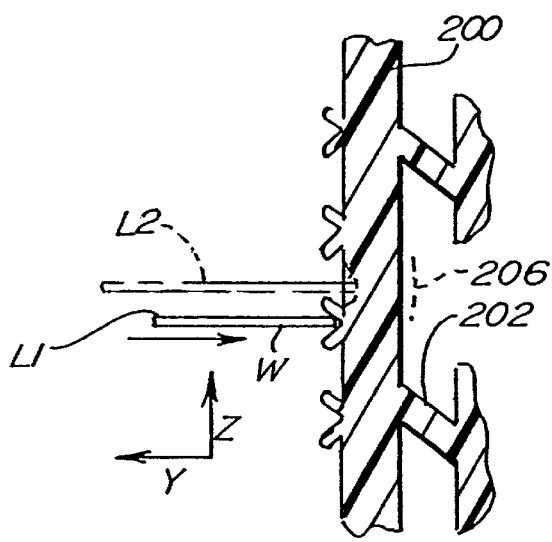
FIG 12 is a cross-sectional view of another lifting means of the invention.

Although wafers are depicted as being shifted between an operational level and a transport level by converging surfaces of wafer receiving elements, it is understood that shifting could be accomplished by other lifting means. For example, referring to FIG. 12 a wafer cushion 200 could be hinged on a four bar linkage 202, such as by living hinges, such that as the wafer is moved inward in the y direction, the wafer is lifted by the four bar linkage action pivoting upwardly to the second level L2. The wafer engagement portion of the cushions moves in the y and z directions to a position labeled 206 axially displacing the wafer. OR, the cushions could be adapted to be placed onto, next to, over, or in conjunction with the internal supports of the receptacle.

What is claimed is:

1. A wafer container for storing and shipping semiconductor wafers in a generally horizontal orientation, the device comprising:

a) a receptacle having a front wafer insertion and removal opening, an interior, a top, bottom, a left side, a right side, and a back side;

b) a pair of columns of vertically stacked inwardly extending shelves, one column positioned in the interior at the left side for engaging the left sides of the wafers and one column positioned in the interior at the right side for engaging the right sides of the wafers, each shelf having a wafer contact portion for contacting the lower side of a wafer seated on said shelf, the pair of columns defining a plurality of slots for insertion of, placement of, and retrieval of wafers from the shelves, the shelves configured for supporting and contacting the wafers at the lower side of said wafers but not at the top side, each such wafer contact portion defining a first support level;

c) a door sized for insertion into and closing the wafer insertions and removal opening, the door having an inwardly facing surface;

d) a first cushion positioned at the inwardly facing surface of the door, the first cushion having a plurality of wafer seating positions for engaging and constraining the front edge of each of the wafers thereby providing upward, downward, and inward constraint at said front edge;

e) a second cushion positioned at the back side in the interior of the receptacle, the second cushion having a plurality of wafer seating portions corresponding with the wafer seating portions of the first cushion for engaging the back edge of each of the wafers thereby providing upward, downward, and inward constraint at said back edge, each of the corresponding wafer seating portions of the first cushion and second cushion defining a second support level, each of said second support levels positioned immediately above a corresponding first support level and axially displace therefrom, and wherein the wafers are moveable from the first support level to the second support level by the first cushion.

2. The device of claim 1, wherein each of the wafer seating portions includes a ramp for guiding the respective wafer into a seated position.

3. The device of claim 2, wherein attachment of the door to the receptacle causes the wafer to be shifted from the first support level to the second support level.

4. The device of claim 1, wherein said door includes a first fastener portion and said first cushion includes a second fastener portion, the first and second fastener portions cooperatively engaging each other to releasably attach said first cushion to said interior surface of said door.

5. The device of claim 1, wherein said back side of the receptacle includes a first fastener portion and said second cushion includes a second fastener portion, the first and second fastener portions cooperatively engaging each other to releasably attach said second cushion to said rear interior surface.

6. A resilient cushion for use in a device for transporting, storing, and shipping semiconductor wafers and disks, the cushion comprising:

a) an elongate body, the body having a front side and a rear side, and edges spaced apart from each other by a web;

b) a plurality of wafer engaging portions attached to and projecting from the front side; and c) means for facilitating deformation of the cushion as the cushion is attached and removed from the device.

7. The resilient cushion of claim 6, wherein said means for facilitating deformation comprises at least one resilient channel extending the length of the cushion, wherein the sides of the channel may be moved relative to each other, thereby permitting the distance between the edges of the cushion to change in response to deformation.

8. The resilient cushion of claim 7, further comprising a pair of receiving portions for a pair of pins of an attachment tool used to attach and remove the cushion to the device.

9. The resilient cushion of claim 7, further comprising at least one thinned linear region, the thinned linear region facilitating the folding of the cushion thereby permitting the distance between the edges of said resilient cushion to change in response to deformation.

10. A combination wafer carrier cushion attachment and removal tool, and a wafer cushion, the combination comprising:

a tool comprising:

a) a first cushion contact portion adapted to engage a first tool receiving portion of a cushion;

b) a second cushion contact portion adapted to engage a second tool receiving portion of a cushion, and, c) the first and second cushion contact portions linked whereby said first segment and said second segment are moveable toward and apart from each other;

a flexible wafer cushion comprising a plurality of wafer engagement portions, at least one pair of oppositely positioned wafer container attachment portions, and one pair of tool receiving portions, the wafer cushion at least partially foldable wherein when the first cushion contact portion and the second cushion contact portion of the tool are engaged with the cushion, and wherein when said cushion contact portions are moved toward and away from each other, the wafer cushion flexes facilitating removal of the cushion from the wafer container.

11. The combination wafer carrier cushion and attachment and removal tool of claim 10, wherein said first and second cushion engagement portions comprise a pair of pins, and wherein the pair of tool receiving portions of the cushion comprise a pair of apertures, the pins sized to be received by the apertures.

12. A wafer carrier for holding a plurality of wafers in axial alignment, the wafers each having a top surface, a bottom surface, and comprising:

a receptacle portion with an open front and a door seatable in the receptacle to close the open front;

a plurality of oppositely positioned wafer supports attached to the carrier for supporting wafers at the bottom side of said wafers and not at the top side of said wafers, said wafer supports defining a first support level for each wafer; and a plurality of wafer engagement elements attached to the carrier to engage each wafer, the wafers moveable by said engagement elements to position each wafer to a second level of support axially displaced from the respective first level of support for each of said wafers.

13. The wafer carrier of claim 12 wherein each engagement element comprises a ramp portion for moving each wafer.

14. The wafer carrier of claim 12 further comprising a pair of wafer cushions, one positioned on the door and the other positioned in the carrier and wherein said pair of wafer cushions comprise the plurality of wafer engagement portions.

15. The wafer carrier of claim 12 wherein the wafers are each supported at their front edge and at their rear edge by the wafer cushions when the wafers are at the second level and wherein the wafers are not supported at their left side and their right side when at said second support level.

16. A wafer handling system for transporting and storing wafers and disks, the system comprising:

a) a receptacle having a wafer insertion and removal opening, an interior with a top, a bottom, a left side, a right side, and a back side, the right side and left side each having a column of wafer support shelves, the wafer support shelves defining a plurality of first wafer support levels;

b) a door for closing the insertion and removal opening, the door having an inwardly facing surface;

c) a first cushion releasably attached on to the inwardly facing surface of the door;

d) a second cushion releasably attached to the back side of the receptacle, wherein the first cushion and the second cushion define a plurality of second support levels, each second support level corresponding to and vertically offset from a first support level;

e) an attachment tool for attaching and removing the cushions to the wafer carrier; and, wherein attachment of the door to the receptacle causes at least one wafer to be shifted from the first support level to the second support level.

17. A method for attaching a longitudinal cushion to a wafer carrier comprising the steps of:

i) providing an attachment tool having first and second segments sized to engage a longitudinal cushion;

ii) engaging the first and second sides of the cushion with the first and second segments of the attachment tool;

iii) actuating the attachment tool;

iv) positioning the first longitudinal cushion adjacent an inwardly facing surface of the carrier having a fastening portion; and v) actuating the attachment tool so that a fastening portion of the longitudinal cushion engages the fastening portion of the inwardly facing surface of the carrier.

18. A wafer carrier for use in processing, storing and transporting semiconductor wafers, the semiconductor wafers each having a front edge and a rear edge, the wafer carrier comprising:

a) a door having an inwardly facing surface;

b) a receptacle having a wafer insertion and removal opening, an interior with a top, bottom, sides, and a rear surface;

c) a first set of opposing wafer supports, the first set of opposing wafer supports defining a first horizontal support level with the first set of opposing wafer supports providing upward constraint at each of said first set of opposing wafer supports and said first set of opposing wafer supports not providing downward constraint at each of said first set of opposing wafer supports; and d) a second set of opposing wafer supports, the second set of opposing wafer supports positionable at a second support level axially displaced upwardly from the first level, wherein said first set of opposing wafer supports do not provide downward constraint and do not provide upward constraint at said first horizontal support level, said second set of opposing wafer supports providing upward and downward constraint to said wafers at said second support level.

19. The wafer carrier of claim 18, wherein said first set of opposing wafer supports are at the interior sides of said wafer carrier receptacle and said second set of opposing wafer supports are at the inwardly facing surfaces of the door and at the rear surface of said wafer carrier.

20. A wafer carrier comprising a plurality of wafer supports for supporting a plurality of wafers in an axially aligned arrangement in the carrier, the wafer supports supporting each wafer at a first level of support, the carrier further comprising a lifting means for axially moving each wafer from the first level of support to an axially displaced second level of support within the carrier.

21. A front opening container for storing and shipping semiconductor wafers and disks in a generally horizontal orientation, the device comprising:

a) a receptacle having a front wafer insertion and removal opening, an open interior with a top, a bottom, a left side, a right side, and a back side, b) a pair of columns of vertically stacked inwardly extending shelves, one column positioned in the interior at the left side for engaging the left sides of the wafers and one column placed at the interior at the right side for engaging the right sides of the wafers, each shelf having a wafer contact portion for contacting the lower side of a wafer seated on said shelf thereby providing upward constraint and no downward constraint, the pair of columns defining a plurality of slots for insertion of, placement of, and retrieval of wafers from the shelves, each such wafer contact portion defining a first support level, said columns of vertically stacked upwardly extending shelves, not providing downward constraint at said first support levels, said shelves not providing upward or downward constraint at said second support level, c) a door sized for closing the open front, the door having an inwardly facing surface;

d) a first cushion positioned forwardly of the columns, the first cushion having a plurality of wafer seating portions for engaging and constraining the front edge of each of the wafers thereby providing upward, downward, and inward constraint at said front edge of each wafer at a second horizontal support level axially displaced from said first horizontal support level; and e) a second cushion positioned rearwardly of the columns in the interior of the receptacle, the second cushion having a plurality of wafer seating portions corresponding with the wafer seating portions of the first cushion for engaging the edge of each of the wafers thereby providing upward, downward, and inward constraint at each of said edges when said wafer are at said second horizontal support level, the wafers moveable from the first support level to the second horizontal support level by at least one of the first cushion and second cushion.

* * * * *